United States Patent [19]
Anthony et al.

[11] Patent Number: 6,064,782
[45] Date of Patent: May 16, 2000

[54] EDGE RECEPTIVE PHOTODETECTOR DEVICES

[75] Inventors: Philip John Anthony, Bridgewater; Wilbur Dexter Johnston, Jr., Mendham Township, Morris County; Orval George Lorimor, Warren; Dirk Joachim Muehlner, Berkeley Heights, all of N.J.

[73] Assignee: Lucent Technologies Inc., Murray Hill, N.J.

[21] Appl. No.: 09/083,496

[22] Filed: May 22, 1998

[51] Int. Cl.[7] ........................................ G02B 6/10
[52] U.S. Cl. ........................ 385/14; 257/184; 257/461; 385/45
[58] Field of Search .................... 257/184, 461; 385/14, 49, 45, 88, 89

[56] References Cited

U.S. PATENT DOCUMENTS

| | | | |
|---|---|---|---|
| 5,321,275 | 6/1994 | Shimizu et al. | 257/21 |
| 5,783,839 | 7/1998 | Morikawa et al. | 257/21 |
| 5,912,500 | 6/1999 | Costello et al. | 257/434 |

*Primary Examiner*—Hung N. Ngo
*Attorney, Agent, or Firm*—Lester H. Birnbaum

[57] ABSTRACT

The invention is a photodetector device and a lightguide circuit incorporating the device. The photodetector device includes a semiconductor region for absorbing light which is incident on an edge surface of the device. The region above the absorbing region is narrow at the edge and fans out in the direction of light propagation in the device.

16 Claims, 2 Drawing Sheets

EDGE RECEPTIVE PHOTODETECTOR DEVICES

FIELD OF THE INVENTION

This invention relates to photodetector devices, and in particular to edge receptive semiconductor photodetector devices, as well as lightguide circuits incorporating the photodetectors.

BACKGROUND OF THE INVENTION

Certain optical transmitters and receivers, such as planar lightguide circuits, require that PIN photodiodes be utilized for light detection. Since such diodes tend to be face-receptive, i.e., the light must be incident on one of the major surfaces of the diode, a turning mirror is generally used to direct the light from an in-plane waveguide to the PIN diode. Fabrication of the turning mirror tends to be difficult and time consuming, and can add considerable cost to the lightguide circuit.

It is desirable, therefore, to provide an edge-receptive photodetector device which does not require a mirror to couple light from the light source to the detector.

SUMMARY OF THE INVENTION

The invention in one aspect is a photodetector device which includes multiple regions of semiconductor material which form an edge surface of the device. The device is adapted to receive light on the edge surface, absorb the light, and to generate carriers in the semiconductor material in response thereto to produce a current which is proportional to the intensity of the incident light. A region of the device has a shape which is narrow at the edge receiving the light and fans out in the direction of light propagation in the device.

In accordance with another aspect, the invention is a lightguide circuit which includes a substrate including a waveguide formed on a surface thereof, the substrate including at least one well formed on one edge of the substrate, a semiconductor laser mounted in the well and aligned with a portion of the waveguide, and a semiconductor device also mounted in the same or another well and aligned with another portion of the waveguide. The device comprises multiple regions of semiconductor material forming an edge surface of the device, the device being adapted to receive light from the waveguide on said edge surface, absorb the light, and to generate carriers in the semiconductor material in response thereto to produce a current which is proportional to the intensity of the incident light. A region of the device has a shape which is narrow at the edge and fans out in the direction of light propagation in the device.

BRIEF DESCRIPTION OF THE FIGURES

These and other features of the invention are delineated in detail in the following description. In the drawing.

It will be appreciated that, for purposes of illustration, these figures are not necessarily drawn to scale.

DETAILED DESCRIPTION

Figure 1:
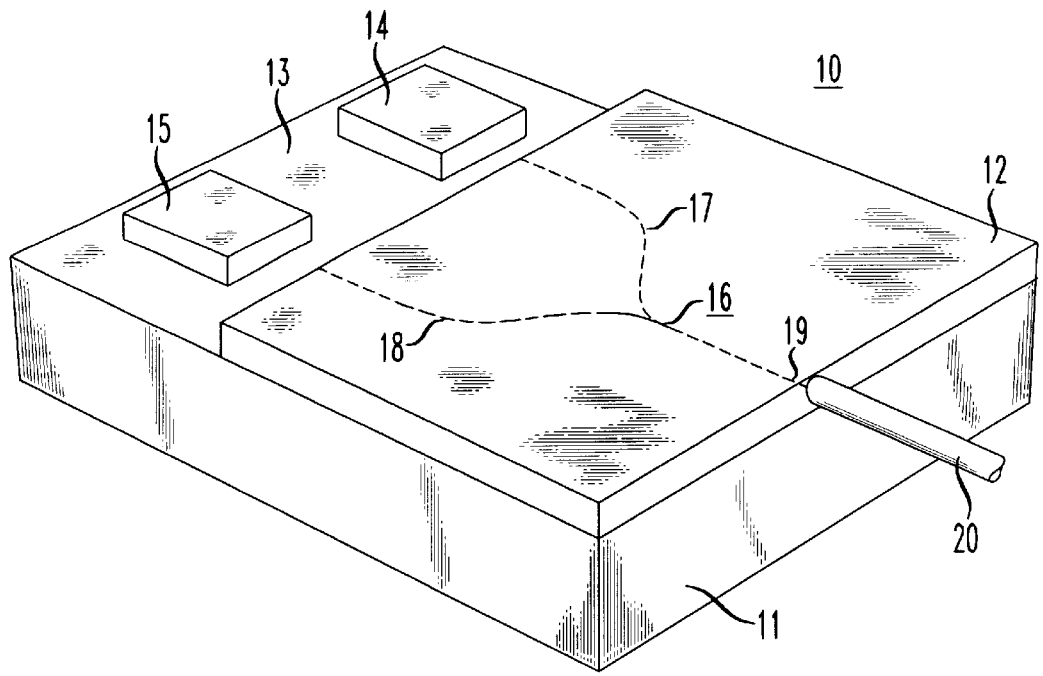
FIG. 1 is perspective view of an optical transmitter in accordance with an embodiment of the invention.

FIG. 1 illustrates a typical optical transmitter, 10, incorporating features of the invention. The transmitter includes a substrate, 11, which is typically silicon. A dielectric layer, 12, which is typically $SiO_2$ is formed on the substrate 11. A waveguide, 16, is formed within the dielectric layer 12 by causing portions of the layer to be doped so as to produce an appropriately varying refractive index. Typical dopants are Boron and/or Phosphorous, and the waveguide may be produced, for example, by depositing first a layer of undoped $SiO_2$ and then a layer of Phosphorous doped $SiO_2$ followed by patterning the phosphorous doped layer photo-lithography to define the waveguide core. Next a top cladding layer is deposited over the core, which top layer is doped with both Boron and Phosphorous. A well or wells (13, for the case of a single common well) is etched into the dielectric layer, down to the substrate. A laser, 14, is bonded to the substrate at the bottom of the well, so that its axis of light emission aligns with the waveguide core. An edge receptive photodetector device, 15, to be further described, is also bonded to the substrate at the bottom of the well 13, so that its axis for light reception aligns with the core of the waveguide. The waveguide 16 includes ports 17 and 18 for the purpose of aligning with the laser 14 and the detector 15, and also includes a port 19 which is aligned with an optical fiber 20. Other devices, such as optical isolators (not shown) may also be on the same substrate.

It will be noted that use of the edge-receptive photodetector, 15, allows the photodetector to receive light directly from the waveguide, without the need for a turning mirror which would be necessary if a face receptive detector were employed. Thus the well or wells for mounting the laser and detector may be etched in a single photolithographic step, and the need for a separate etching step to define turning mirrors is not required. Not only is the complexity of the fabrication process reduced thereby, but the yield will be improved as well, since the turning mirror fabrication usually requires the simultaneous etching of a vertical wall to terminate the waveguide core and a nominally 45 degree surface to reflect the light upwards to the face receptive detector—a technologically challenging step which is not compatible with standard photolithography and requires a "gray-scale" mask or a differently erodable, undercutting masking layer, either of which are considerably more complex than the use of conventionally patterned resists and "black or white" masks.

Figure 2:
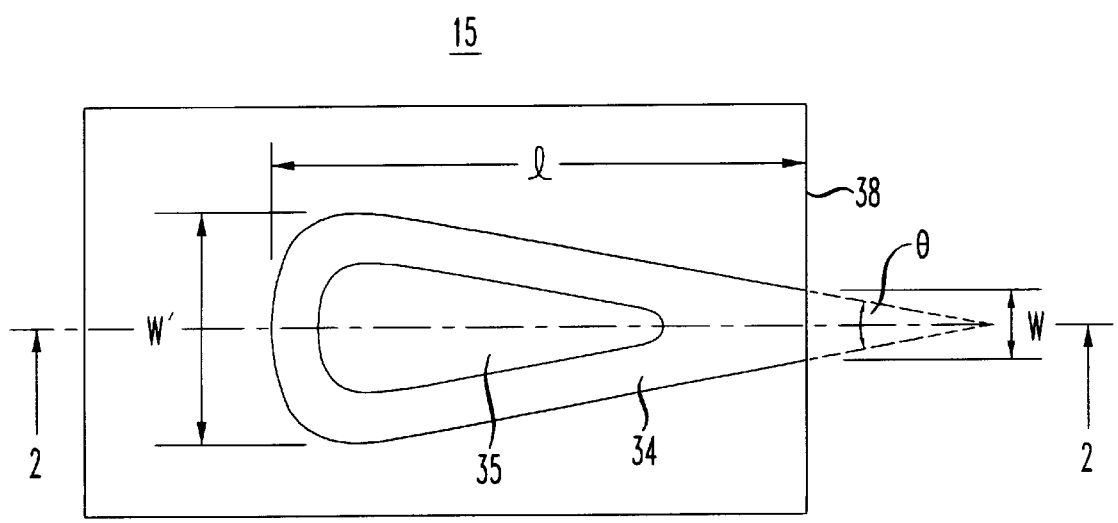
FIG. 2 is a plan view of a photodetector device in accordance with an embodiment of the invention.
Figure 3:
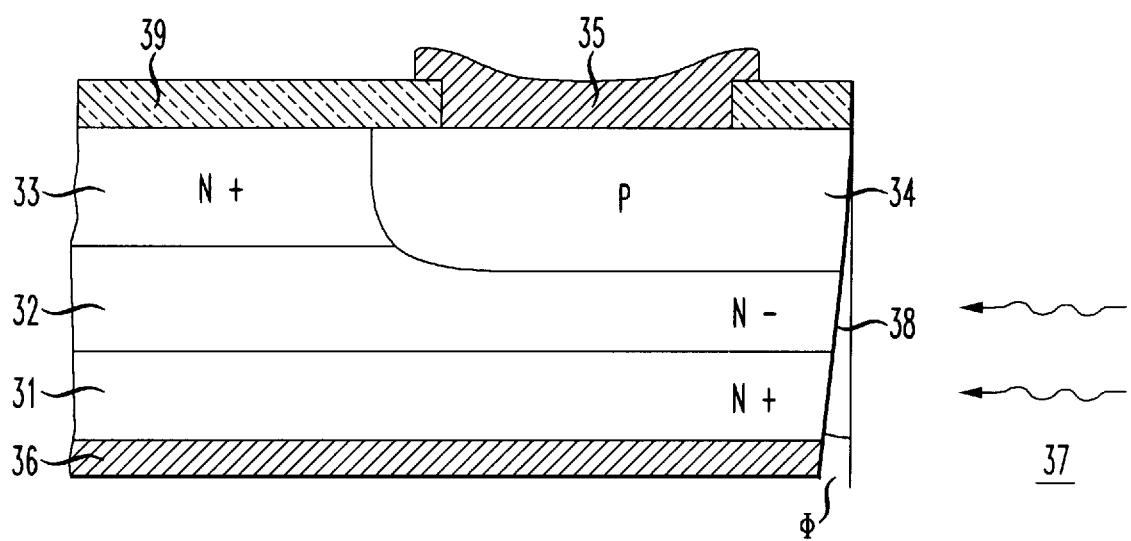
FIG. 3 is a cross sectional view of the device of FIG. 2.

FIGS. 2 and 3 illustrate one embodiment of an edge receptive photodetector, 15, in accordance with the invention. FIG. 2 is a plan view of the device, and FIG. 3 is a cross sectional view along section 2—2 (through the axis). The photodetector includes a first region, 31, (e.g., a substrate) of semiconductor material having a first conductivity type, which in this example is N+type. This region can be, for example, InP doped with Silicon or Sn to a concentration giving $2 \times 10^{18}$ electrons per cubic cm. A second region, 32, is formed on top of this first region by, for example, vapor phase epitaxy. Hydride or trichloride or metallorganic chemical vapor deposition epitaxy techniques well known in the art may be used. Typically this deposition is made onto a surface oriented by 2 degrees away from the principal (100) surface of region 31. Utilization of this property will be further described below. This layer may be InGaAs or InGaAsP, having a bandgap such that the light of interest can be absorbed and converted to electron/hole pairs. This layer is typically not doped with impurities and is intrinsic-n-type with a background electron concentration of $5 \times 10^{15}$ or less per cubic cm. On top of this a third region of n-type InP (33) is formed, accomplished by vapor phase epitaxy as described above for layer 32. This layer is typically doped to a concentration of $2 \times 10^{17}$ $cm^{-3}$.

A p type conductivity region 34 is then formed into the topmost layer 33 by ion implantation or diffusion of an acceptor species, such as Zn. This region is defined by an appropriate diffusion or implant mask, which is photolithography patterned so that region 34 is formed into a fan shape as shown schematically in FIG. 2. The depth of the implant or diffusion is controlled so as to type convert the upper N+InP layer 33 and so that a P/n-intrinsic junction results between the implanted region 34 and the intrinsic InGaAsP or InGaAs layer 32. The mask is typically stripped off, and a new dielectric layer 39, is deposited and patterned on the surface of regions 33 and 34. A p-contact metallization 35 is formed contacting the region 34, and an n-contact (36) is formed either to the first region 31 at the back side, or to the top layer 33 outside the region 34. These contact metallizations constitute standard electrodes allowing for the biasing and electrical connection of the device to external circuitry and the methods for their preparation are well known in the art.

In operation light represented by the arrows 37 is incident on the edge 38 of the device. This edge is typically formed by cleaving the InP material constituting the first region 31 on a (110) plane. If the deposition of the second region 32 took place conventionally on a 2 degree off-oriented surface, this cleaved edge may be selected to be 2 degrees away from the perpendicular to the planes of the device layers as shown by angle Ø in FIG. 3. The light 37 upon entering the device will then be refracted upwards toward the absorbing layer 32 and the reflecting contact, 35, that will reflect light back down to the absorbing layer, and this is beneficial. Additionally, epitaxial growth may be performed on a surface oriented more than 2 degree off the (100) surface, and, consequently, the angle, Ø, may be increased to enhance the refraction of light toward the absorbing layer 32 and hence further enhanced the quantum efficiency. In general, angle Ø is preferably 4–5 degrees.

It will be appreciated that while FIG. 3 shows the device with the contact layer (34) at the top, it is conventional in actual use to mount the device with the p-contact down, facing the board to which it is mounted.

The light will be guided along the absorbing layer owing to the higher refractive index of the layer 32, and will be absorbed as it propagates into the device. In the plane of the absorbing layer there is no waveguiding and the light will spread out by diffraction. Depending on the light beam spot size exiting the waveguide port 18 this spreading angle will vary, but is typically between 10 and 50 degrees full angle for typical waveguide ports. The spreading angle within the device will of course be less than that which would have been observed had the beam been allowed to expand freely into the air. The edge surface of the device 38 is provided with an antireflective coating (not shown) so that the light enters into the device and is not reflected back toward the waveguide port 18.

The dimensions of the p-region 34 are chosen in relation to the thickness and composition of the absorbing region 32 and with regard to the desired quantum efficiency and speed of operation of the device. The fan angle, θ, should be large enough so that the light, as it spreads within the device in the plane of the layer 32, does not spread outside of the region underlying 34. In general, angles of 1–50 degrees will be used, with a preferred range of 10–50 degrees. The initial width w of the region 34 should be such that the light beam enters entirely within the region underlying 34. This may be for example 10 μm corresponding to a waveguide port with a core width of 7 μm and an allowance for alignment tolerance of +/−1.5 μm. In general, the width w will be 2–25 microns, and the largest width w' will be at least 20 microns. The overall length 1 of the region 34 measured down the light propagation axis should be long enough that most or all of the light is absorbed, or at least that sufficient light is absorbed that the design quantum efficiency is met. This length will vary depending upon the composition and thickness of layer 32. In general, a length, 1, of 20–70 μm is preferred. The area of the region 34 determines the area and hence the capacitance of the p-n junction in the device. The capacitance of the p-n junction is one variable determining the limiting speed of operation of the device (the lower the capacitance the faster) and it is desirable to reduce the area accordingly unless other parameters have become the limiting factor. One such other limiting factor is the transit time of carriers across the p-n junction. At the same time, it is desirable that the area of the region 34 should not be too small, as the photocurrent density must be limited to an upper limit, typically $1 \times 10^5$ amp/cm$^2$. If the junction area is too small, this will restrict the maximum photocurrent and hence light signal, and will limit the useful dynamic range. It should also be arranged that the light spreads through the intended absorption region and is not absorbed too precipitously. This can be arranged by designing the thickness of the layer 32 so that the effective absorption coefficient for the light in the structure (some of the light mode is propagating in the absorber and some in the transmissive InP) is in the range of 20 to 1000 per cm. Thus it can be seen that the detailed geometrical design will depend on the detailed application intended, but from this teaching the design may readily be prepared by one skilled in the art for any specific application.

What is claimed is:

1. A photodetector device comprising multiple regions of semiconductor material forming an edge surface of the device, the device being adapted to receive light on said edge surface, absorb the light, and to generate carriers in the semiconductor material in response thereto to produce a current which is proportional to the intensity of the incident light, a region of the device having a shape which is narrow at the edge and fans out in the direction of light propagation in the device.

2. The device according to claim 1 wherein a region which absorbs the light comprises a material selected from the group consisting of InGaAs and InGaAsP.

3. The device according to claim 1 wherein the region which fans out has a width at the edge in the range 2–25 microns, and a maximum width within the device greater than 20 μm.

4. The device according to claim 1 wherein the region which fans out has a fan angle within the range 1–50 degrees.

5. The device according to claim 1 wherein the multiple regions comprise an N-Type region, an undoped region, and a P-type region.

6. The device according to claim 5 wherein the region which fans out comprises the P-Type region.

7. The device according to claim 1 wherein the region which fans out comprises InP doped with a p-type impurity.

8. The device according to claim 1 wherein the multiple regions are formed so that the edge makes an angle of 4–5 degrees with a line perpendicular to the major region of the layers.

9. A lightguide circuit comprising:
   a substrate including a waveguide formed on a surface thereof, the substrate including at least one well formed in the substrate;
   a semiconductor laser mounted in the well and aligned with its axis of light emission coinciding with a portion of the waveguide; and a semiconductor device mounted in said well or in another well and aligned with its axis for light reception coinciding with another portion of the waveguide, the device comprising multiple regions of semiconductor material forming an edge surface of the device, the device being adapted to receive light from the waveguide on said edge surface, absorb the light, and to generate carriers in the semiconductor material in response thereto to produce a current which is proportional to the intensity of the incident light, a region of the device having a shape which is narrow at the edge and fans out in the direction of light propagation in the device.

10. The circuit according to claim 9 wherein the substrate comprises silicon.

11. The circuit according to claim 9 wherein the region which absorbs the light comprises a material selected from the group consisting of InGaAsP and InGaAs.

12. The circuit according to claim 9 wherein the region which fans out has a width at the edge in the range 2–25 microns, and a maximum width within the device of at least 20 $\mu$m.

13. The circuit according to claim 9 wherein the region which fans out has a fan angle within the range 1–50 degrees.

14. The circuit according to claim 9 wherein the multiple regions comprise an N-Type region, an undoped region, and a P-type region.

15. The circuit according to claim 14 wherein the region which fans out comprises the undoped region.

16. The circuit according to claim 9 wherein the region which fans out comprises InP doped with a p-type impurity.

* * * * *